(12) United States Patent
Rafique et al.

(10) Patent No.: US 10,917,170 B2
(45) Date of Patent: Feb. 9, 2021

(54) METHOD AND APPARATUS FOR TRANSMITTING DATA IN A SUPER CHANNEL

(71) Applicant: Xieon Networks S.à.r.l., Luxembourg (LU)

(72) Inventors: Danish Rafique, Germering (DE); Stefano Calabró, Munich (DE)

(73) Assignee: XIEON NETWORKS S.a.r.l., Luxembourg (LU)

(*) Notice: Subject to any disclaimer, the term of this patent is extended or adjusted under 35 U.S.C. 154(b) by 0 days.

(21) Appl. No.: 16/091,787

(22) PCT Filed: Mar. 23, 2017

(86) PCT No.: PCT/EP2017/056913
§ 371 (c)(1),
(2) Date: Oct. 5, 2018

(87) PCT Pub. No.: WO2017/186418
PCT Pub. Date: Nov. 2, 2017

(65) Prior Publication Data
US 2019/0165857 A1 May 30, 2019

(30) Foreign Application Priority Data
Apr. 26, 2016 (EP) .................................. 16167039

(51) Int. Cl.
*H04B 10/50* (2013.01)
*H04B 10/516* (2013.01)
(Continued)

(52) U.S. Cl.
CPC ...... *H04B 10/07953* (2013.01); *H03M 13/25* (2013.01); *H04B 10/5161* (2013.01);
(Continued)

(58) Field of Classification Search
CPC ............... H04B 10/506; H04B 10/5161; H04J 14/0241; H04J 14/0256–0265; H04J 14/0298
See application file for complete search history.

(56) References Cited

U.S. PATENT DOCUMENTS

| | | | |
|---|---|---|---|
| 9,673,907 B1* | 6/2017 | Vassilieva | H04B 10/5161 |
| 2004/0001555 A1* | 1/2004 | Taffin | H04L 1/0068 375/261 |
| 2013/0215942 A1* | 8/2013 | Addepalli | H04L 1/007 375/224 |

FOREIGN PATENT DOCUMENTS

| | | |
|---|---|---|
| EP | 2 355 432 A1 | 8/2011 |
| WO | 2010/024619 A2 | 3/2010 |

OTHER PUBLICATIONS

Maher, Robert et al. "Spectrally shaped DP-16QAM super-channel transmission with multi-channel digital back-propagation." Scientific reports vol. 5 8214. Feb. 3, 2015, doi:10.1038/srep08214 (Year: 2015).*

(Continued)

*Primary Examiner* — Nathan M Cors

(57) ABSTRACT

Disclosed herein is a method for transmitting digital data in a super channel, in which a set of carriers are packed in a predetermined bandwidth. The set of carriers comprises higher and lower edge carriers having the highest and lowest wavelengths, respectively, among said set of earners, wherein data is transmitted via the higher and lower edge carriers using a corresponding modulation format, each modulation format using a constellation diagram comprising a number of symbols, wherein a binary address is associated with each symbol. Said method comprises the steps of: separating digital data to be transmitted via each of said higher and lower edge carriers into corresponding first and second data streams, and for each of said higher and lower (Continued)

edge carriers, mapping the data of the first data stream to predetermined first bit positions within the binary symbol addresses and the data of the second data stream to predetermined second bit positions within the binary symbol addresses, wherein said first bit positions are bit positions which have an error probability less than the average error probability of all bit positions.

40 Claims, 6 Drawing Sheets

(51) Int. Cl.
*H04J 14/02* (2006.01)
*H04B 10/079* (2013.01)
*H04L 27/34* (2006.01)
*H04L 5/00* (2006.01)
*H03M 13/25* (2006.01)
*H04L 27/36* (2006.01)
*H04L 1/00* (2006.01)
*H04J 14/06* (2006.01)

(52) U.S. Cl.
CPC .......... *H04J 14/0298* (2013.01); *H04L 1/007* (2013.01); *H04L 5/006* (2013.01); *H04L 5/0007* (2013.01); *H04L 5/0044* (2013.01); *H04L 27/34* (2013.01); *H04L 27/3405* (2013.01); *H04L 27/363* (2013.01); *H04L 27/364* (2013.01); *H04J 14/06* (2013.01)

(56) References Cited

OTHER PUBLICATIONS

International Search Report and Written Opinion, PCT/EP2017/056913, dated Jun. 6, 2017, 13 pages.

\* cited by examiner

METHOD AND APPARATUS FOR TRANSMITTING DATA IN A SUPER CHANNEL

RELATED APPLICATIONS

This application is a 35 U.S.C. 371 national stage filing of International Application No. PCT/EP2017/056913, filed on Mar. 23, 2017, which claims priority to European Patent Application No. 16167039.3, filed on Apr. 26, 2016. The entire contents of these applications are incorporated herein by reference in their entirety.

FIELD OF THE INVENTION

The present invention is in the field of optical data transmission. In particular, the invention relates to a method for transmitting in a super channel, as well as corresponding transmitters and receivers.

BACKGROUND OF THE INVENTION

In optical networks using coherent carriers, currently available data transfer rates are on the order of 100 Gb/s per channel. As indicated in FIG. 1(a), a data transfer rate of 100 Gb/s can e. g. be achieved using polarization division multiplexing quaternary phase shift keying (PM-QPSK) with a symbol rate of 30 Gbaud. In FIGS. 1(a) to 1(e), the horizontal axis represents the frequency and the vertical axis the power spectral density of the signal.

In order to increase the data transmission rates, either higher order modulation formats or higher baud rate transmission systems could in principle be employed. For example, as indicated in FIG. 1(b), a data transmission rate of 400 Gb/s can be obtained by using a PM-256QAM modulation format and a symbol rate of 30 Gbaud. However, this modulation scheme is extremely sensitive to the optical signal-to-noise ratio (OSNR), which is a limiting factor for the transmission performance.

Alternatively, a data transmission rate of 400 Gb/s could conceivably be obtained using a PM-16QAM modulation format and an increased symbol rate of 60 Gbaud, as shown in FIG. 1(c). However, in practice the highest baud rates currently achievable are in fact on the order of 30 Gbaud, due to the limited speed of the available digital electronics.

In view of this, currently the PM-16QAM modulation format is regarded as an optimum com-promise between improved data transfer rate and reduced tolerance to noise, or, in other words, increased OSNR requirements. However, this only allows for a moderate increase in the data transmission rate up to approximately 200 Gb/s per channel.

A further improvement can be achieved by means of so-called "super channels", in which several sub-channels, referred to herein as "carriers", are packed in a fixed band width and are treated as a single channel in the network. Since the carriers of the super channel are jointly treated as a single channel by the network and hence need not be separated by means of filters or the like upon traversing the network, the carriers of the super channel can be more densely spaced than ordinary WDM channels, so that more information can be transmitted per band width as compared to ordinary WDM channels. This is schematically shown in FIGS. 1(d) and 1(e), where super channels with two and five carriers, respectively, are shown. Assuming again a symbol baud rate of 30 Gbaud and a PM-16QAM modulation format, the two carrier multichannel of FIG. 1(d) allows for a data transmission rate of 400 Gb/s, and the five carrier super channel of FIG. 1(e) for a data transmission rate of 1 TB/s.

When a super channel passes an optical network, it will typically pass a number of wavelength selective filters. However, in practice such filters exhibit a certain amount of instability, in particular a filter drift or detuning of the wavelength range passed by the filter, which is also referred to as "filter window" herein. Such drift or detuning may lead to a deterioration in the quality of data transmission which is also referred to as "filter penalty" in the art. In order to cope with this problem, in the prior art, guard bands were added to both sides of the super channel, as schematically shown in FIG. 2a. FIG. 2a shows a spectral representation of an exemplary super channel 10 comprising five closely packed carriers 12, each having a bandwidth of 37.5 GHz. At the spectrally higher and lower boundary of the super channel 10, so-called guard bands 14 are provided, each guard band 14 having in this example a bandwidth of one half bandwidth of a super channel carrier 12, i.e. 18.75 GHz. As used herein, a "guard band" is a spectral region reserved for a channel or super channel in which no information is carried. When the super channel 10 of FIG. 2a passes a filter that is subjected to some drift, such that its pass window does not precisely match the spectrum of the super channel 10, the idea is that this drift only affects the spectral region of the guard bands 14, but not the carriers 12 of the super channel 10 carrying the information. However, the spectral bandwidth associated with the guard bands is obviously lost for data transmission, thereby effectively decreasing the spectral efficiency.

EP 2355432 A1 discloses a method and arrangement for transmitting an orthogonal frequency diversity multiplex (OFDM) signal via at least one optical signal. According to this prior art, OFDM channels located near one edge of an OFDM spectrum are copied and shifted to in opposite edge of the OFDM spectrum. At the receiver, symbols are derived from original and copied OFDM channels, and the symbols having a better signal quality are selected for further processing. The situation is schematically shown in FIG. 2b, showing and OFDM spectrum with a total bandwidth of 37.5 GHz, where the outermost channels of the OFDM spectrum carry the same information, which is why they are referred to as "carrier replica" in FIG. 2b. Accordingly, if one of the carrier replicas is compromised due to a filter drift, the same information can be discerned from the other carrier replica, by either selecting the better quality carrier, or by combining allocated signals from both replicas such as to obtain optimized symbols.

Similar to the example of FIG. 2a, in this case too the bandwidth corresponding to one channel is sacrificed for coping with filter penalties.

SUMMARY OF THE INVENTION

The problem underlying the invention is to provide a method and apparatus for transmitting using a super channel that allows for coping with filter penalties with an improved spectral efficiency as compared to the prior art. This problem is solved by a method and apparatus according to the present invention.

According to one aspect of the invention, a method for transmitting digital data in a super channel is provided, in which a set of carriers are packed in a predetermined band width. The set of carriers comprises higher and lower edge carriers having the highest and lowest wavelengths, respectively, among said set of carriers. Data is transmitted via the higher and lower edge carriers using a corresponding modulation format, which may or may not be identical. Each modulation format uses a constellation diagram comprising a number of symbols, wherein a binary address is associated with each symbol. The method comprises the steps of:

Separating digital data to be transmitted via each of said higher and lower edge carriers into corresponding first and second data streams, and for each of said higher and lower edge carriers, mapping the data of the first data stream to predetermined first bit positions within the binary symbol addresses and the data of the second data stream to predetermined second bit positions within the binary symbol addresses, wherein said first bit positions are bit positions which have an error probability less than the average error probability of all bit positions.

Since the first bit positions have a relatively low error probability, they are also referred to as bits with "better protection" herein. By mapping, for each of the higher and lower edge carriers, data to be transmitted to two different data streams with different degrees of protection, more efficient use can be made of the available spectrum for different degrees of filter penalty. Note that the invention also encompasses cases where the digital data transmitted via each of said higher and lower edge carriers is separated into more than two different data streams, such as three or even more different data streams which are mapped to three or more different bit positions or groups of bit positions with different error probabilities. However, the invention requires that the digital data transmitted via each of said higher and lower edge carriers is separated into at least two different data streams and mapped to corresponding bit positions with different error probabilities.

In a preferred embodiment, the data transmitted via the second data streams of said higher and lower edge carriers is at least predominantly identical, while the data transmitted via the first data streams of said higher and lower edge carriers is different from each other. The rationale behind this embodiment is that even in case of filter penalty, the first data streams of the edge carriers still allow for sufficient transmission quality, due to their better protection. On the other hand, the redundancy is reserved for the second data streams, which are more prone to error due to filter penalty. Accordingly, while in the prior art described with reference to FIG. 2 above, always a band width worth of one channel carrier is sacrificed, either in the form of guard bands or carrier replica, in this embodiment, only a fraction of one channel is sacrificed, namely the part corresponding to the second data stream. It follows that the performance is very similar to that achieved according to the prior art shown in FIG. 2, but with a higher spectral efficiency.

In an alternative embodiment, the data transmitted via the second data streams of said higher and lower edge carriers is different from each other and the data transmitted via the first data streams of said higher and lower edge carriers is likewise different from each other. In other words, in this embodiment there is no redundancy whatsoever, so this operating mode will only work for mild filter penalties. However, even if the filter penalty should be such that the transmission quality of one or both of the second data streams becomes insufficient, there is nevertheless possible that the transmission quality of one or both of the first data streams is still sufficient. In in this situation, one or both of the second data streams can simply be discarded, i.e. not processed at the receiver side. Herein, the term "sufficient transmission quality" could for example mean that the associated bit error rate (BER) is below a predetermined threshold that allows for forward error correction (FEC). With this mode of operation, in case of increased distortion or filter penalty, there hence remains the chance to at least receive the data transmitted in one or both of the first data streams in situations, where for the same degree of distortion, and without mapping a data stream to stronger bit positions, all information would be lost.

Conversely, in a yet further alternative, the data transmitted via the second data streams of said higher and lower edge carriers may be at least predominantly identical and the data transmitted via the first data streams of said higher and lower edge carriers may likewise be at least predominantly identical. In this mode of operation, one would therefore have a full carrier worth of redundancy, and hence a spectral efficiency which is the same as that shown in the prior art of FIG. 2. However, this embodiment has a benefit over the prior art that in case of comparatively strong distortion, where the transmission even with the guard bands of FIG. 2a or with the carrier replica of FIG. 2b fails, at least the transmission quality of the data within the first data streams is sufficient, such as to allow to maintain at least some high-priority traffic assigned to the first data streams.

Note that in some embodiments it is possible to dynamically switch between the three alternatives, i.e. between embodiments with no redundancy, with a full carrier worth of redundancy or with redundancy only within the second data streams, depending on the degree of distortion or filter penalty. This dynamical switching can e.g. be based on an assessment of the quality of the data transmission at the receiver side and communication of the same to the transmitter side.

It can be shown that with this class of mapping of bits, indeed "quadrant bits" can be defined which have a lower error probability. Specific examples thereof are shown in the description of the preferred embodiment below.

Preferably, a separate forward error correction is applied to each of the first and second data streams. This way it is ensured that in cases where the average bit error rate of both, the first and second data streams of a given edge carrier in combination is too high to allow for forward error correction, at least the forward error correction of the first data stream is possible, because it will exhibit lower bit error rate.

In a preferred embodiment, the aforementioned modulation format is one of 16QAM, 32QAM, 64QAM, or 128QAM.

In a preferred embodiment, the method further comprises a step of assessing the quality of the edge carriers at a receiver side.

For example, the step of assessing the quality of the edge carrier may comprise measuring a bit error rate in the data transmitted via said edge carrier. However, this has the disadvantage that the received signal has to undergo full processing until the bit error rate can be established. This is both time and power consuming.

Accordingly, in a preferred embodiment, said step of assessing the quality of the edge carrier comprises measuring the power spectral density (PSD) of the respective edge carrier. Namely, if an edge carrier is affected by filter penalty, this will lead to a decrease in the PSD, which can be assessed much quicker than the bit error rate and with less power consumption. If by the analysis of the PSD it can already be determined that one of the edge carriers is too weak, it can simply be rejected and not be processed, thereby saving processing power. Note that an important source of filter penalty is a so-called filter drift, where the passband of the filter drifts in one spectral direction. Such a drift will hence affect one edge carrier stronger than the other, and hence lead to a situation where the PSD of one edge carrier is significantly lower than that of the other. Moreover, since the PSD can be measured rather quickly, and in particular much quicker than determining a BER, a filter drift can be quickly noticed and reacted to.

In a preferred embodiment, the power spectral density is measured using an optical performance monitor. Optical performance monitors are used in state of the art system to measure peak signal power, optical signal-to-noise-ratio, frequency and the like. The same monitors can likewise be used to measure the power spectral density.

In an alternative embodiment, the PSD is measured digitally based on the digitized signal. In this embodiment, both edge carriers need to be detected, and the PSD can only be determined after digitization thereof. However, in this scenario the PSD can be determined right after the digitization, and if it turns out that the PSD is so low that the entire edge carrier is to be rejected, any further digital processing of the carrier can be omitted, thereby saving power.

In a preferred embodiment, the data transmitted via the second data streams of said higher and lower edge carriers is at least predominantly identical, and the method further comprises a step of selecting, at a receiver side, among the second data streams of said higher and lower edge carriers the one with the better quality, wherein preferably only the edge carrier with the better quality is processed on the receiver side.

Alternatively, the data transmitted via the second data streams of said higher and lower edge carriers is again at least predominantly identical, but the method further comprises a step of co-processing the second data streams to decode the same information carried therein, in particular by "maximum ratio combining". "Maximum ratio combining" is a per se known technique used in diversity receivers. Instead of selecting the best received signal, according to this technique a better performance can be obtained by using a linear combination of all received signals. The weighting factors of the linear combiner can be optimized to maximize the signal-two-noise ratio.

In a preferred embodiment, the method further comprises a step of changing one or both of a symbol rate and the modulation format employed for one or both of the edge carriers depending on the quality of the data transmission, in particular on the bit error rate or the PSD. For example, if the original modulation format in the edge carrier is 64QAM (six bits per symbol), and the quality of the data transmission is insufficient, the modulation format can be downgraded to 16QAM (four bits per symbol), or even downgraded to QPSK (two bits per symbol), i.e. to modulation formats that are increasingly less sensitive to filter penalties. Similarly, the symbol rate can likewise be dynamically reduced, in order to cope with filter penalties. This of course requires a feedback from the receiver to the transmitter side.

As is seen from the above description, various embodiments of the invention deal with possible filter penalties without the use of guard bands. Nevertheless, the method may further comprise a step of adding a guard band to one or both of the edge carriers, based on the assessment of the respective edge carrier quality. Namely, if it is determined that the transmission quality of one of the edge carriers deteriorates significantly, a guard band may selectively be added to this edge carrier.

According to a further aspect of the invention, a transmitter for transmitting digital data in a super channel is provided, in which a set of carriers are packed in a predetermined band width. The set of carriers comprises higher and lower edge carriers having the highest and lowest wavelengths, respectively, among said set of carriers, wherein said transmitter is configured to transmit data via the higher and lower edge carriers using a corresponding modulation format, each modulation format using a constellation diagram comprising a number of symbols, wherein a binary address is associated with each symbol. The transmitter is configured for carrying out the steps of:

separating digital data to be transmitted via each of said higher and lower edge carriers into corresponding first and second data streams, for each of said higher and lower edge carriers, mapping the data of the first data stream to predetermined first bit positions within the binary symbol addresses and the data of the second data stream to predetermined second bit positions within the binary symbol addresses, wherein said first bit positions are bit positions which have an error probability less than the average error probability of all bit positions.

According to a yet further aspect of the invention, a receiver for receiving digital data in a super channel is provided, in which a set of carriers are packed in a predetermined band width. The set of carriers comprises higher and lower edge carriers having the highest and lowest wavelengths, respectively, among said set of carriers, wherein data is transmitted via the higher and lower edge carriers using a corresponding modulation format, each modulation format using a constellation diagram comprising a number of symbols, wherein a binary address is associated with each symbol, and wherein digital data transmitted via each of said higher and lower edge carriers comprises first and second data streams. The receiver is configured to carry out the step of for each of said higher and lower edge carriers, demapping data of a said first data stream from predetermined first bit positions within the binary symbol addresses and the data of said second data stream from predetermined second bit positions within the binary symbol addresses, wherein said first bit positions are bit positions which have an error probability less than the average error probability of all bit positions.

Preferably, one or both of the transmitter and receiver are configured to be used in a method according to one of the embodiments recited above.

SHORT DESCRIPTION OF THE FIGURES

DESCRIPTION OF THE PREFERRED EMBODIMENTS

Figure 1:
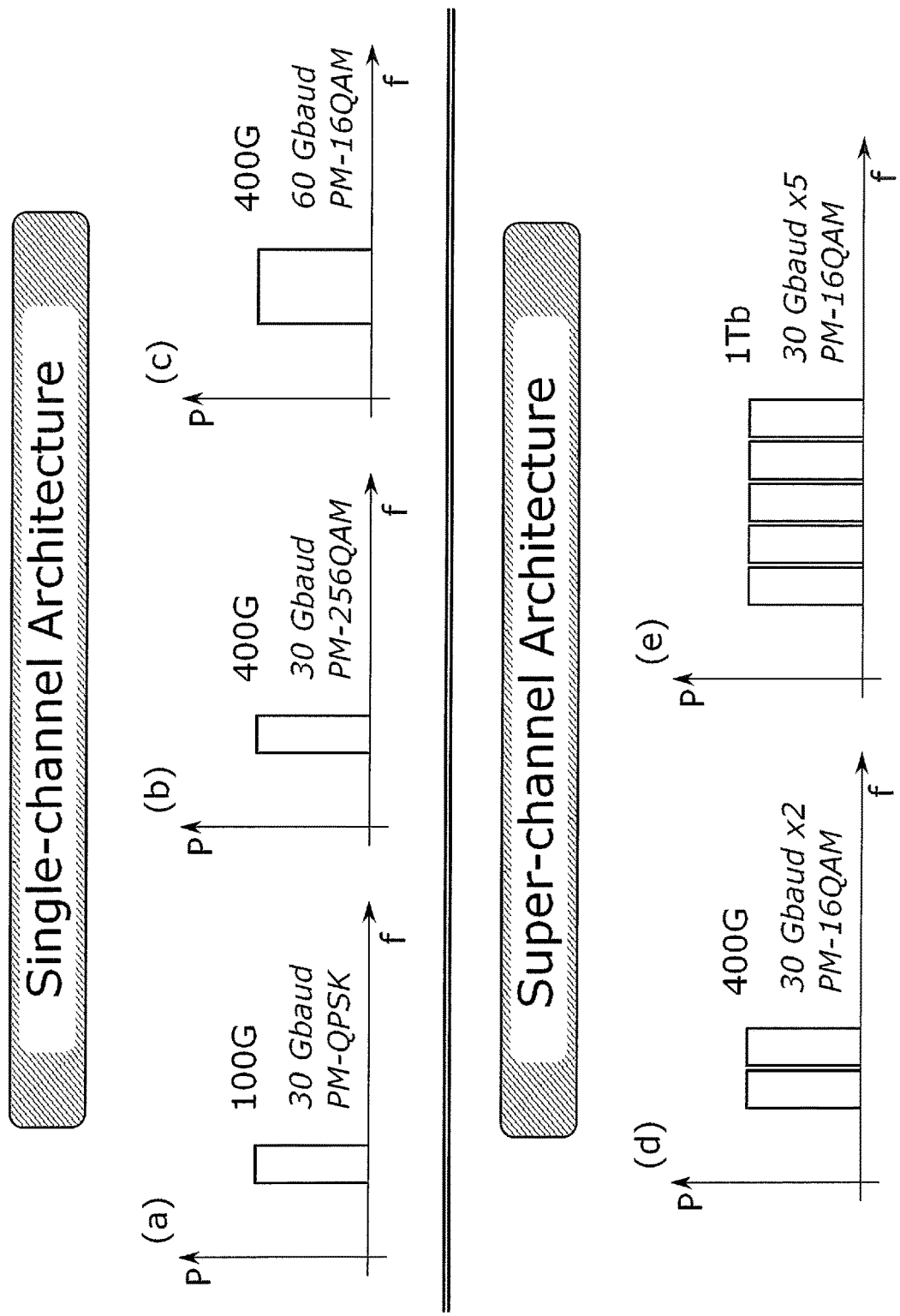
FIG. 1 is a schematic overview illustrating single channel and super channel architectures.

For the purposes of promoting an understanding of the principles of the invention, reference will now be made to the preferred embodiments illustrated in the drawings and specific language will be used to describe the same. It will, nevertheless, be understood that no limitation of the scope of the invention is thereby intended, such alterations and further modifications in the illustrated device and such further applications of the principles of the invention as illustrated therein being contemplated as would normally occur now or in the future to one skilled in the art to which the invention relates.

Figure 3:
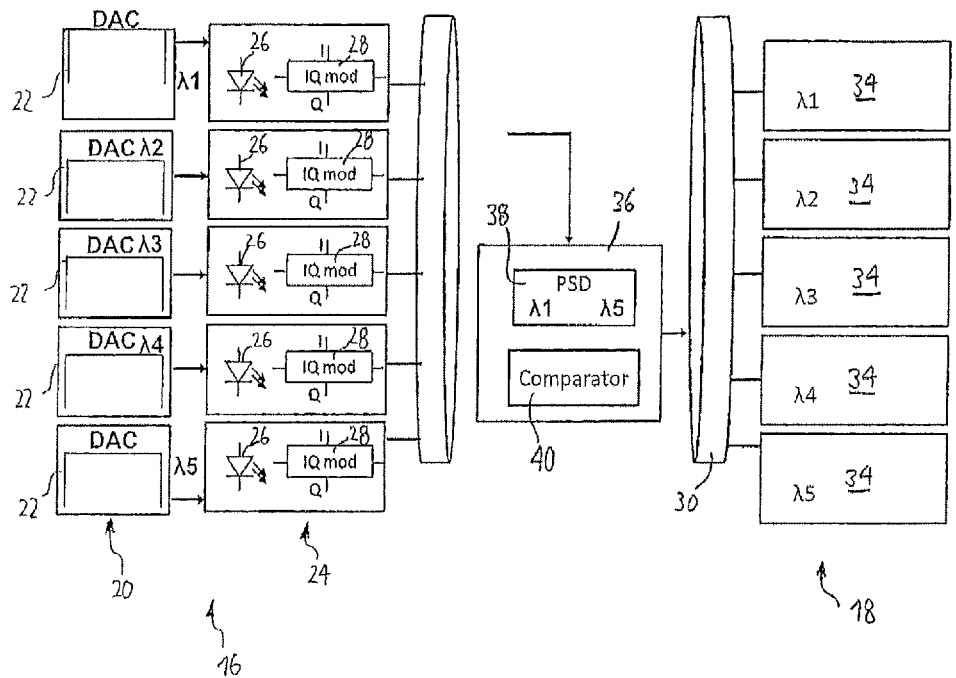
FIG. 3 is a schematic diagram of a transmitter and a receiver for transmitting data via a super channel, wherein the receiver comprises an optical OPM device for measuring a PSD of the edge channels.

FIG. 3 schematically shows a transmitter 16 and a receiver 18 for transmitting digital data in a super channel, in which five carriers with wavelengths $\lambda_1$ to $\lambda_5$ are densely packed within a predetermined band width. Herein, $\lambda_1$ is the longest wavelength and hence represents the upper edge carrier, while $\lambda_5$ is the shortest wavelength and hence represents the lower edge carrier. The transmitter 16 comprises a transmitter electronics section 20 comprising five digital analog converter (DAC) blocks 22 for converting digital data signals into analog modulation signals. The transmitter 16 further comprises a photonic integrated circuit (PIC) 24 comprising five laser diodes 26 and five corresponding IQ modulators 28, each for generating one of the carriers.

The receiver 18 comprises a coherent front end 30, which in the preferred embodiment is again formed by a PIC platform, and comprises photodetectors and local oscillators (not shown) for demodulating the received carriers $\lambda_1$ to $\lambda_5$ in the usual manner, without further description herein. Note that for brevity, a "carrier having a wavelength $\lambda_1$" is also referred to herein as "carrier $\lambda_1$".

Downstream of the coherent front end 30, a receiver electronics section 32 is provided, which in the shown embodiment comprises five digital signal processors (DSP) 34 for digitizing the demodulated carriers $\lambda_1$ to $\lambda_5$ and processing the digital signal such as to mitigate transmission impairments of the optical carriers $\lambda_1$ to $\lambda_5$ in the digital domain. Examples of such transmission impairments are chromatic dispersion, polarization mode dispersion, differential group delay, polarization mixing, and symbol timing uncertainties, and the processing of the digital signals to mitigate such effects can be quite power consuming.

In the embodiment shown in FIG. 3, an optical performance monitor (OPM) 36 is provided at the receiver 18 in front of the coherent front end 30, which comprises a PSD determining unit 38 for determining the PSD of the edge carriers $\lambda_1$ and $\lambda_5$, and a comparator 40 which compares the PSD determined for the edge carriers $\lambda_1$ and $\lambda_5$ with each other. As mentioned before, due to a filter drift of filters arranged in the network (not shown) between the transmitter 16 and the receiver 18, it may happen that one of the edge carriers is strongly attenuated or nearly cut off, which can be immediately determined by the OPM, because the PSD of the respective edge carrier will be significantly lower than that of the other edge carrier. In cases like this, the receiver 18 can simply discard the respective edge carrier, which is schematically indicated in FIG. 3, where five carriers enter the OPM and only for carriers are passed to the coherent front end 30. This way, the power for digitally processing one of the carriers can be saved. However, in alternative embodiments, a reduced PSD of one of the edge carriers $\lambda_1$ or $\lambda_5$ can be communicated to the transmitter 16, together with the instruction to e.g. add a guard band to the edge carrier, or to downgrade the modulation format with regard to bits per symbol or symbol rate, to thereby respond dynamically to a filter drift or the like. Since the PSD can be determined very quickly, much quicker than e.g. to first process the edge carrier and then determine the BER, it becomes possible to react quickly to filter drifts.

Figure 4:
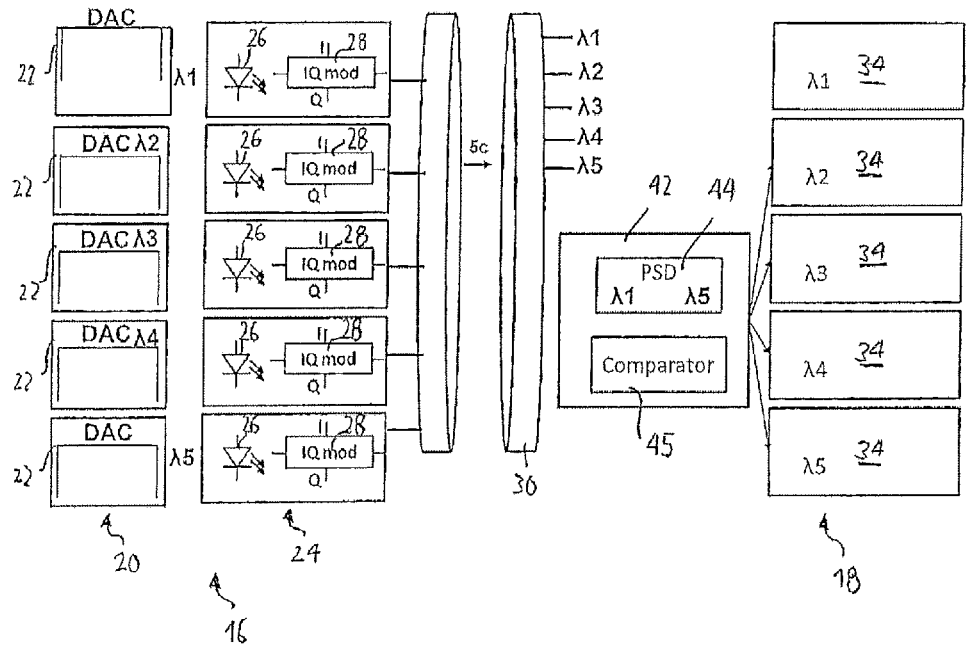
FIG. 4 is a schematic diagram of a transmitter and a receiver for transmitting data via a super channel, wherein the receiver is adapted to digitally determine the PSD of the edge channels.

Instead of determining the PSD with an OPM 36 as shown in FIG. 3, it is also possible to determine the PSD based on the digitized signals, as indicated in FIG. 4. In this case, a processing unit 42 is arranged downstream of the coherent front end 30 to receive the digitized signals and carry out a digital spectral calculation to determine the PSD for the edge carriers using a PSD determination functionality schematically indicated at 44 and compare the two PSDs using a comparator functionality schematically indicated at 45. If it turns out that the PSD of one of the edge carriers is significantly lower than that of the other edge carrier, then the further digital processing of this edge carrier can be omitted, thereby saving electrical power. This is schematically indicated in FIG. 4, where only the digital signals corresponding to the carriers $\lambda_2$ to $\lambda_5$ are further processed in DSPs 34, while the digital signal of the upper edge carrier $\lambda_1$ is not further processed. The remainder of FIG. 4 is identical to FIG. 3, and the description shall not be repeated. As the skilled person will appreciate, the gain of electrical amplifiers in front of a digitizer are usually automatically controlled to keep the digital power constant. Accordingly, a difference in the PSD can be easily estimated by comparing the gains of the electrical amplifiers rather than the digital powers.

Note that assessing the quality of an edge carrier based on the PSD is an optional feature, and that the invention may also be carried out without it. Moreover, it should be appreciated that in case a low PSD of one of the edge carriers is observed, this does not necessarily mean that the edge carrier as a whole is dropped, but this could rather trigger further response, such as adding a guard band or downgrading the modulation format, as indicated above.

Figure 5:
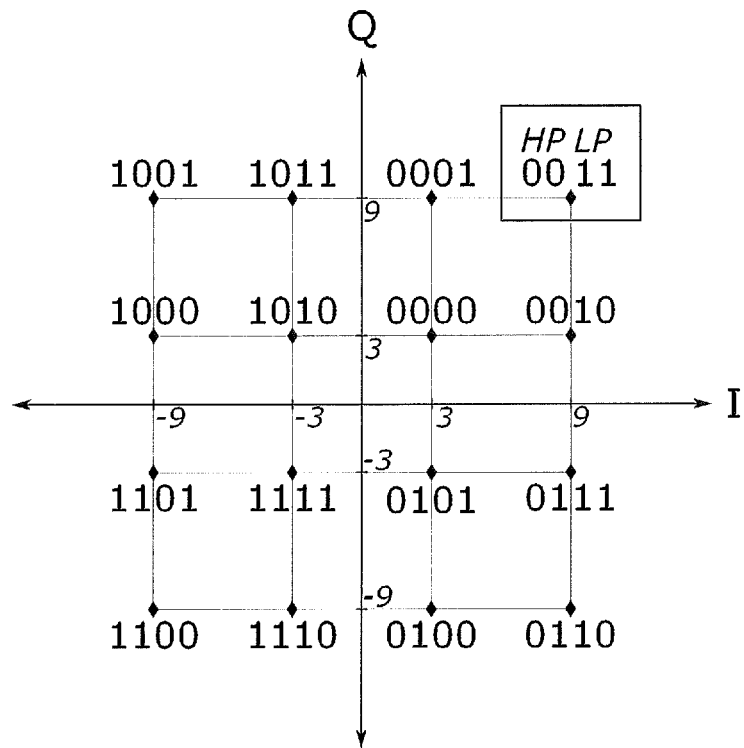
FIG. 5 is a 16QAM constellation diagram with binary addresses associated with each symbol.

FIG. 5 shows a constellation diagram for the 16QAM modulation format, which comprises 16 symbols arranged in the IQ plane. A binary address is associated with each symbol, and in each binary address of the symbols within the same quadrant of the IQ plane, the two leftmost bits are identical. It can be easily verified that the error probability of the two leftmost bits is lower than the average error probability of all bit positions, and in particular lower than the error probability of the two rightmost bits. According to the invention, for each edge carrier, the digital data to be transmitted is separated into corresponding first and second data streams. The data of the first data stream is mapped to "first bit positions" having a lower error probability, which "first bit positions" in the constellation diagram of FIG. 5 would correspond to the two leftmost bit positions in each bit address. In the example shown, the second data stream would be mapped to "second bit positions" which have a lesser error protection, namely the two rightmost bit positions in each bit address.

Figure 6:
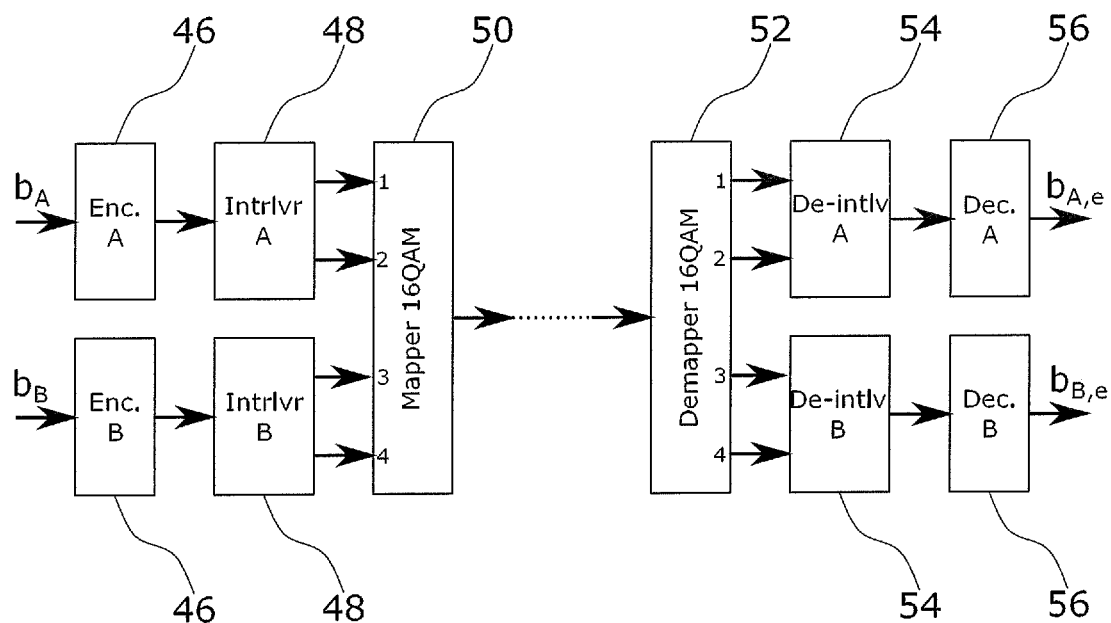
FIG. 6 shows an arrangement of encoders, interleavers and a mapper at a transmitter side as well as arrangement of a demapper, de-interleavers and decoders at a receiver side.

FIG. 6 shows two identical encoders A and B at reference sign 46, two interleavers A and B at reference sign 48 and a mapper 50, which would be provided at the transmitter 16 of FIG. 3. FIG. 6 further shows a demapper 52, de-interleavers A and B at reference sign 54 and decoders A and B at reference sign 56, which would be provided at the receiver 18 of FIG. 3.

The first and second data streams are represented in FIG. 6 by bit streams $b_A$ and $b_B$, respectively, and are separately encoded by the two identical encoders A and B shown at reference sign 46. Each encoded data stream is distributed by the corresponding interleaver 48 between two different inputs of the mapper 50, corresponding to different bit positions in the binary address. The receiver 18 implements the corresponding sequence of inverse operations using the demapper 52, the de-interleavers 54 and the decoders A and B shown at reference sign 56.

Figure 7:
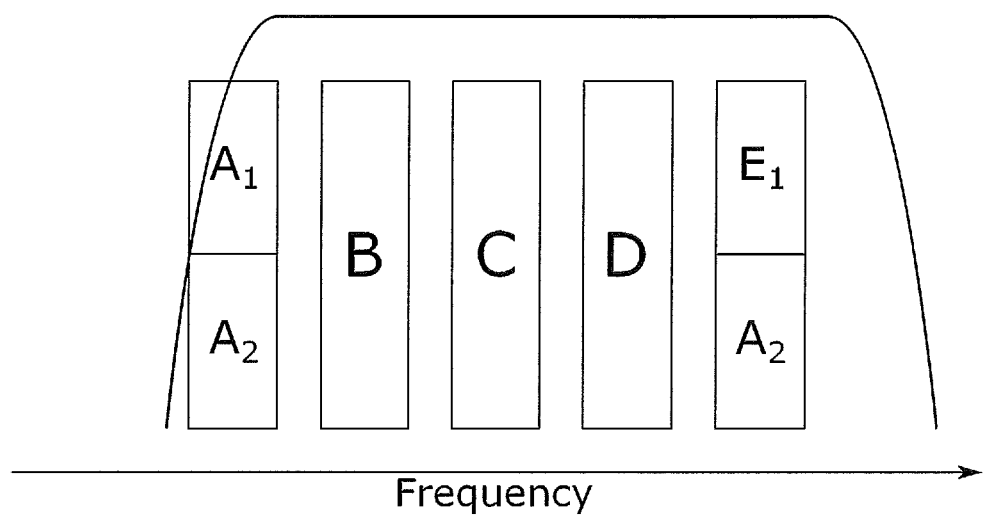
FIG. 7 shows a spectral representation of a super channel and the data carried in each of its carriers, as well as a corresponding filter window.

FIG. 7 shows a spectral representation of a super channel 10 comprising again five carriers $\lambda_1$ to $\lambda_5$. The intermediate carriers $\lambda_2$, $\lambda_3$ and $\lambda_4$ carry digital data "B", "C" and "D", respectively. The higher edge carrier $\lambda_1$, at the lower frequency edge of the spectrum, carries data $A_1$ in the first data stream, i.e. with higher error protection, and data $A_2$ in the second data stream, i.e. with lower error protection. The lower edge carrier $\lambda_5$, at the higher frequency edge of the spectrum, carries data $E_1$ in the first data stream, i.e. with higher error protection, and the same data $A_2$ in the second data stream of the higher edge carrier $\lambda_1$.

Further schematically shown in FIG. 7 is a filter window 58 provided by one or more filters (not shown) to be passed within the network between the transmitter 16 and the receiver 18. As is seen in FIG. 7, the filter window 58 is not precisely aligned with the spectrum of the super channel 10, which is indicative of a filter detuning or "filter drift". As a result of that, the upper edge carrier $\lambda_1$ will be attenuated, and the transmission quality of the second data stream carrying the data $A_2$ may be insufficient. However, since the identical data is likewise contained in the second data stream of the lower edge carrier $\lambda_5$, which is not affected by the filter drift, no data is lost. And since the data $A_1$ within the upper edge carrier $\lambda_1$ is carried in the first data stream having better error protection, it may still have a sufficiently low bit error rate to allow for forward error correction, in spite of the filter drift indicated in FIG. 7. Accordingly, all data $A_1$, $A_2$ and $E_1$ can be successfully transmitted, i.e. without loss of information, in spite of a considerable filter penalty.

With regard to the data $A_2$, at the receiver 18, among the corresponding second data streams of the edge carriers $\lambda_1$, $\lambda_2$ the one with better quality may be selected and processed (in this case, the second data stream of the lower edge carrier $\lambda_5$), while the other is ignored. Which one of the second data streams has the better quality can be determined e.g. by determining the bit error rate, but could also be determined based on the PSD of the corresponding edge carriers. Alternatively, the second data streams of the edge carriers $\lambda_1$ and $\lambda_5$ can be co-processed such as to combine the information that can be derived therefrom, for example by "maximum ratio combining".

Figure 8:
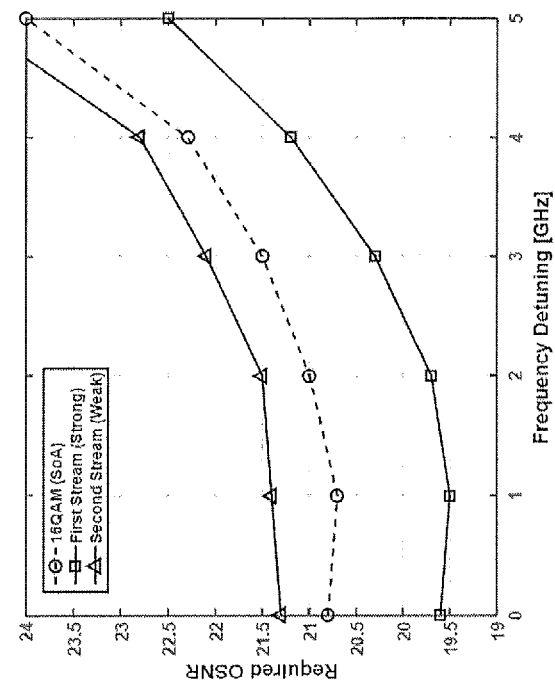
FIG. 8 shows in the left diagram a required OSNR as a function of the number of filters to be passed, and in the left diagram a required OSNR as a function of the frequency detuning of a filter to be passed.
Figure 8:
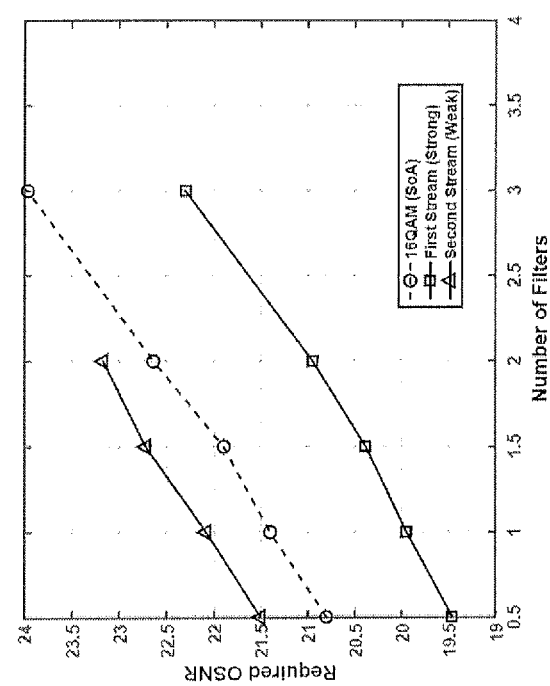

FIG. 8 shows in the left diagram the required optical signal-to-noise ratio (OSNR) of the edge carrier as a function of the number of filters to be passed by the super channel according to the state of the art, as well as for the first and second data streams according to the invention, as determined by simulations. As is seen from the diagram, in each case the required OSNR increases with number of filters to be passed, as is to be expected. However, as is further seen from the diagram, the required OSNR of the first data stream is considerably lower than the required OSNR according to prior art for the same number of filters. From this, it is seen that indeed the data contained in the first data stream can, at the same OSNR, be successfully transmitted through a larger number of filters than is possible in prior art, indicating that in fact the first data stream is comparatively robust against filter penalties. This is indicated as "filter gain" in the left diagram of FIG. 8.

The right diagram of FIG. 8 shows the required OSNR as a function of frequency detuning of a filter. Again, it is seen that the first data stream can, at a given OSNR, handle considerably larger degrees of frequency detuning, which is indicated as "drift gain" in the right diagram of FIG. 8.

Figure 2:
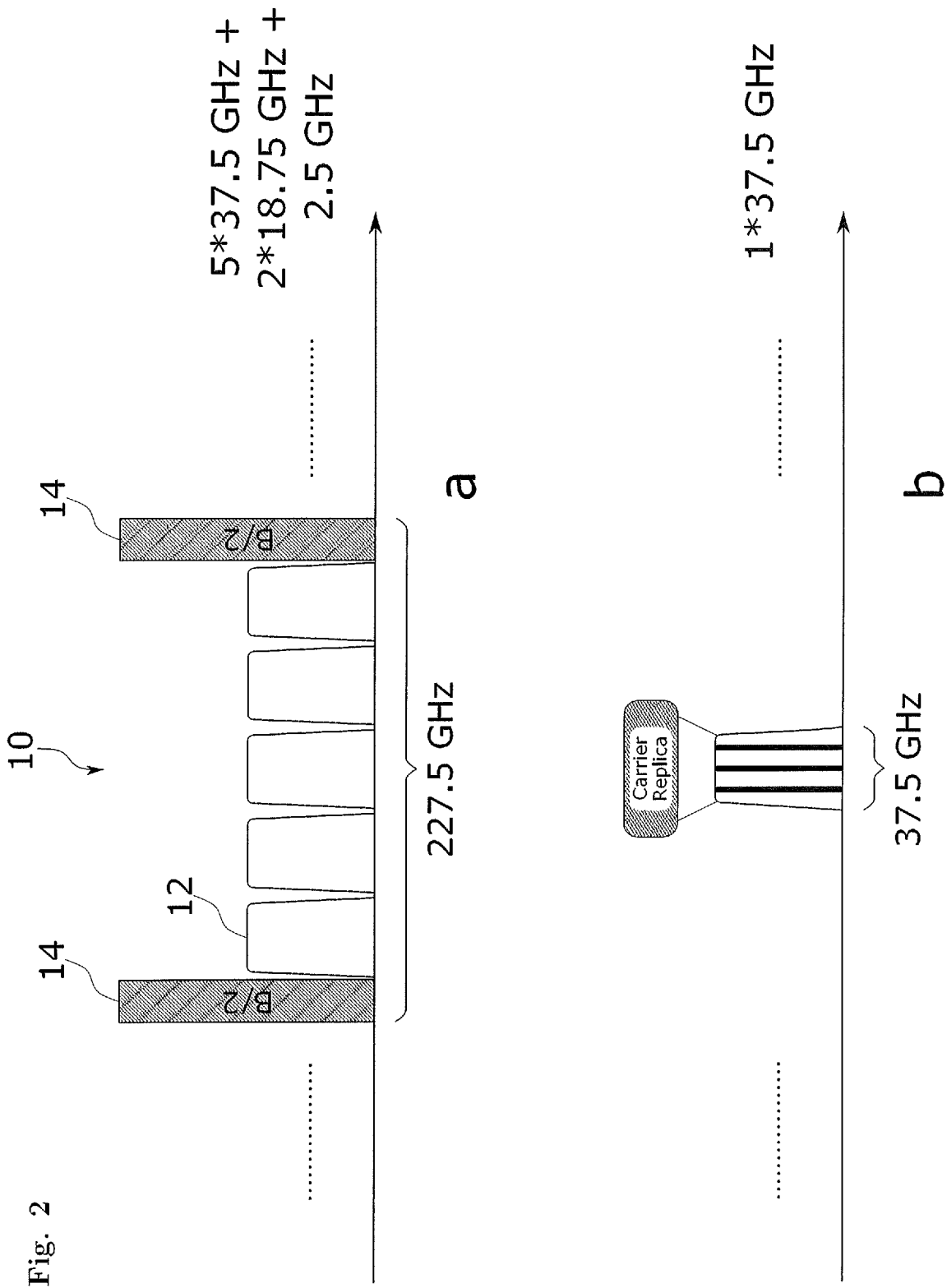
FIG. 2a shows a prior art super channel with guard bands.
FIG. 2b shows a prior art OFDM spectrum with carrier replica is at the edges.

So in summary, it is expected that by separating the data in the edge carriers in first and second data streams with higher and lower error protection, and including redundant data only in the second data streams, a similar performance can be obtained as in the prior art indicated in FIG. 2 above, but at a better spectral efficiency. This operating mode can be routinely employed, even without any feedback from the receiver 18 to the transmitter 16 with regard to the quality of the data transmission in the edge carriers.

However, in other embodiments, the quality of the data transmission can be assessed at the receiver side, and the receiver 18 can send instructions to the transmitter 16 to adjust the data transmission accordingly. For example, if it is seen from the quality of the transmitted data in the edge carriers $\lambda_1$ and $\lambda_5$ that there is only a mild filter penalty, the receiver 18 and transmitter 16 can agree that no redundant data is sent within the edge carriers, thereby increasing the spectral efficiency even further. If in this operation mode a filter drift occurs, then this would typically only affect the second data stream of one of the edge carriers, while the data transmitted via the first data streams of both edge carriers and the second data stream of the other edge carrier will be successfully transmitted.

Conversely, if it is seen from the quality of the transmitted data in the edge carriers $\lambda_1$ and $\lambda_5$ that there is a rather harsh filter penalty, the receiver 18 and transmitter 16 can agree to transmit the same data in the first data stream of each edge carrier, and to also transmit the same data in the second data stream of each edge carrier, which is however different from the data transmitted in the respective first data streams. While this may look at first sight similar to the scenario FIG. 2b, in case of very large filter penalty, at least the data transmitted in the first data streams will be successfully transmitted, thereby allowing to better ensure the successful transmission of higher priority data within the edge carriers.

Moreover, in response to the detected quality of the data transmission in the edge carriers, the receiver 18 and transmitter 16 can agree to adapt the modulation format, for example changing from modulation formats with more bits per symbol to those with fewer bits per symbol in case of a decrease in transmission quality, and vice versa in case the transmission quality improves, for example if a detuned filter is readjusted. With such dynamical adjustment of the modulation format, an optimum spectral efficiency can be obtained for a given degree of filter penalty. Instead of or in addition to adjusting the modulation format, also the symbol rate can be adjusted, i.e. lowered in case of insufficient transmission quality and increased in case of good transmission quality. Alternatively or in addition, a guard band can be added to one or even both of the edge carriers, based on the assessment of the respective edge carrier quality. In all of these examples, the transmission quality can advantageously be assessed based on the PSD of the corresponding edge carriers, which allows for a quick and simple assessment of the filter penalty involved with the edge carriers.

While specific reference has been made to the mapping of data streams to bit positions within bit addresses of the 16QAM modulation format, bit positions with better protection can be likewise identified in other modulation formats, and the same scheme can reply to such modulation formats as well.

The examples described above and the drawings merely serve to illustrate the invention and its advantages over the prior art, and should not be understood as a limitation in any sense. The scope of the invention is solely determined by the appended set of claims.

LIST OF REFERENCE SIGNS 10 superchannel
12 carrier
14 guard band
16 transmitter
18 receiver
20 transmitter electronic section
22 DAC blocks
24 photonic integrated circuit
26 laser diode
28 IQ modulator
30 coherent front end
32 receiver electronic section
34 digital signal processor
36 optical performance monitor
38 PSD determining unit
40 comparator
42 processing unit
44 PSD determination functionality
45 comparator functionality
46 encoder
48 interleaver
50 mapper
52 demapper
54 de-interleaver
56 decoder
58 filter window

The invention claimed is:

1. A method for transmitting using a super channel, the super channel having a set of carriers, each of which having a corresponding one of a set of wavelengths, the set of wavelengths being within a predetermined bandwidth, the set of carriers comprising a higher edge carrier and a lower edge carrier, the higher edge carrier having a corresponding highest wavelength among the set of wavelengths and the lower edge carrier having a corresponding a lowest wavelength among the set of wavelengths, the method comprising the steps of:
    modulating the higher edge carrier according to a first modulation format, the first modulation format being based on a first constellation comprising a first set of symbols, wherein each symbol of the first set of symbols has a corresponding one of a first set of binary addresses;
    modulating the lower edge carrier according to a second modulation format, the second modulation format being based on a second constellation comprising a second set of symbols, wherein each symbol of the second set of symbols has a corresponding one of a second set of binary addresses;
    separating digital data to be transmitted on the higher edge carrier into a first data stream and a second data stream;
    separating digital data to be transmitted on the lower edge carrier into a third data stream and a fourth data stream;
    mapping the first data stream to predetermined first bit positions of a first plurality of bit positions within the first set of binary addresses, and the second data stream to predetermined second bit positions of the first plurality of bit positions within the first set of binary addresses, wherein the predetermined first bit positions within the first set of binary addresses have an error probability that is less than an average error probability associated with the first plurality of bit positions within the first set of binary addresses;
    mapping the third data stream to predetermined first bit positions of a second plurality of bit positions within the second set of binary addresses, and the fourth data stream to predetermined second bit positions of the second plurality of bit positions within the second set of binary addresses, wherein the predetermined first bit positions within the second set of binary addresses have an error probability that is less than an average error probability associated with the second plurality of bit positions within the second set of binary addresses; and
    wherein at least one of:
        the first data stream is at least predominantly identical to the third data stream, and
        the second data stream is at least predominantly identical to the fourth data stream.

2. The method according to claim 1, wherein the data separated into the second data stream is at least predominantly identical to the data separated into the fourth data stream, and wherein the data separated into the first data stream is different from the data separated into the third data stream.

3. The method according to claim 1, wherein the first modulation format is a same modulation format as the second modulation format.

4. The method according to claim 3, wherein the data separated into the second data stream is at least predominantly identical to the data separated into the fourth data stream, and wherein the data separated into the first data stream is at least predominantly identical to the data separated into the third data stream.

5. The method according to claim 1, wherein at least one of the first constellation and the second constellation is a two-dimensional constellation comprising four quadrants.

6. The method according to claim 5, wherein in each of the binary addresses of the two-dimensional constellation, there are two predetermined bit positions which have identical values for each of the binary addresses within a same quadrant, the two predetermined bit positions corresponding to the first bit positions.

7. The method according to claim 1, wherein forward error correction is applied to at least one of:
    the first data stream separately from an application of forward error correction to the second data stream, and
    the third data stream separately from an application of forward error correction to the fourth data stream.

8. The method of claim 1, wherein at least one of the first modulation format and the second modulation format is one of 16QAM, 32QAM, 64QAM, or 128QAM.

9. The method of claim 1, further comprising the steps of:
    receiving the higher edge carrier and the lower edge carrier; and
    assessing, at a receiver side, a quality of each of the received higher edge carrier and the received lower edge carrier.

10. The method of claim 9, wherein the step of assessing the quality comprises measuring a bit error rate.

11. The method of claim 9, wherein the step of assessing the quality comprises measuring a power spectral density.

12. The method of claim 11, wherein the power spectral density is measured using an optical performance monitor.

13. The method of claim 11, wherein the power spectral density is measured digitally.

14. The method according to claim 9, wherein the data separated into the second data stream is at least predominantly identical to the data separated into the fourth data stream, and wherein the method further comprises the steps, at a receiver side, of:
demapping each of the second data stream of the received higher edge carrier and the fourth data stream of the received lower edge carrier; and
assessing a quality of each of the demapped second data stream and the demapped fourth data stream; and
selecting for further processing a higher-quality one of the demapped second data stream and the demapped fourth data stream, as determined by the assessing step.

15. The method according to claim 1, wherein the data separated into the second data stream is at least predominantly identical to the data separated into the fourth data stream, and wherein the method further comprises the steps of:
receiving the higher edge carrier and the second data stream;
receiving the lower edge carrier and the fourth data stream; and
co-processing, by maximum ratio combining, each of the received second data stream and the received fourth data stream, to decode the at least predominantly identical information.

16. The method of claim 9, further comprising a step of changing, based on the step of assessing the quality, at least one of:
a symbol rate associated with the higher edge carrier,
a symbol rate associated with the lower edge carrier,
the first modulation format, and
the second modulation format.

17. The method of claim 9, further comprising a step of adding a guard band to at least one of the higher edge carrier and the lower edge carrier, based on the step of assessing the quality.

18. A transmitter for transmitting using a super channel, the super channel having a set of carriers, each of which having a corresponding one of a set of wavelengths, the set of wavelengths being within a predetermined bandwidth, the set of carriers comprising a higher edge carrier and a lower edge carrier, the higher edge carrier having a corresponding highest wavelength among the set of wavelengths and the lower edge carrier having a corresponding lowest wavelength among the set of wavelengths, the transmitter operable to carry out the steps of:
modulating the higher edge carrier according to a first modulation format, the first modulation format being based on a first constellation comprising a first set of symbols, wherein each symbol of the first set of symbols has a corresponding one of a first set of binary addresses;
modulating the lower edge carrier according to a second modulation format, the second modulation format being based on a second constellation comprising a second set of symbols, wherein each symbol of the second set of symbols has a corresponding one of a second set of binary addresses;
separating digital data to be transmitted on the higher edge carrier into a first data stream and a second data stream;
separating digital data to be transmitted on the lower edge carrier into a third data stream and a fourth data stream;
mapping the first data stream to predetermined first bit positions of a first plurality of bit positions within the first set of binary addresses, and the second data stream to predetermined second bit positions of the first plurality of bit positions within the first set of binary addresses, wherein the predetermined first bit positions within the first set of binary addresses have an error probability that is less than an average error probability associated with the first plurality of bit positions within the first set of binary addresses;
mapping the third data stream to predetermined first bit positions of a second plurality of bit positions within the second set of binary addresses, and the fourth data stream to predetermined second bit positions of the second plurality of bit positions within the second set of binary addresses, wherein the predetermined first bit positions within the second set of binary addresses have an error probability that is less than an average error probability associated with the second plurality of bit positions within the second set of binary addresses; and
wherein at least one of:
the first data stream is at least predominantly identical to the third data stream, and
the second data stream is at least predominantly identical to the fourth data stream.

19. The transmitter according to claim 18, wherein the data separated into the second data stream is at least predominantly identical to the data separated into the fourth data stream, and wherein the data separated into the first data stream is different from the data separated into the third data stream.

20. The transmitter according to claim 18, wherein the first modulation format is a same modulation format as the second modulation format.

21. The transmitter according to claim 18, wherein the data separated into the second data stream is at least predominantly identical to the data separated into the fourth data stream, and wherein the data separated into the first data stream is at least predominantly identical to the data separated into the third data stream.

22. The transmitter according to claim 18, wherein at least one of the first constellation and the second constellation is a two-dimensional constellation comprising four quadrants.

23. The transmitter according to claim 22, wherein in each of the binary addresses of the two-dimensional constellation, there are two predetermined bit positions which have identical values for each of the binary addresses within a same quadrant, the two predetermined bit positions corresponding to the first bit positions.

24. The transmitter of claim 18, wherein at least one of the first modulation format and the second modulation format is one of 16QAM, 32QAM, 64QAM, or 128QAM, and wherein forward error correction is applied to at least one of:
the first data stream separately from an application of forward error correction to the second data stream, and
the third data stream separately from an application of forward error correction to the fourth data stream.

25. The transmitter of claim 18, wherein the transmitter is configured for changing, in response to a transmission bit error rate, at least one of:

a symbol rate associated with the higher edge carrier, a symbol rate associated with the lower edge carrier, the first modulation format, and the second modulation format.

26. The transmitter of claim 18, wherein the transmitter is configured for adding a guard band to at least one of the higher edge carrier and the lower edge carrier, in response to information regarding transmission quality.

27. The transmitter of claim 18, wherein the first modulation format is a same modulation format as the second modulation format.

28. A receiver for receiving from a transmitter an optical signal transmitted using a super channel, the super channel having a set of carriers, each of which having a corresponding one of a set of wavelengths, the set of wavelengths being within a predetermined bandwidth, the set of carriers comprising a higher edge carrier and a lower edge carrier, the higher edge carrier having a corresponding highest wavelength among the set of wavelengths and the lower edge carrier having a corresponding lowest wavelength among the set of wavelengths, the receiver operable to carry out the steps of:

receiving the signal transmitted by the transmitter, the received signal comprising the higher edge carrier and the lower edge carrier;

to generate a received first data stream from the received signal, demapping received data from predetermined first bit positions of a first plurality of bit positions within a first set of binary addresses that each correspond to one of a first set of symbols of a first constellation of a first modulation format according to which the higher edge carrier was modulated at the transmitter, wherein the predetermined first bit positions of the first plurality of bit positions within the first set of binary addresses have an error probability that is less than an average error probability associated with the first plurality of bit positions within the first set of binary addresses;

to generate a received second data stream from the received signal, demapping received data from predetermined second bit positions of the first plurality of bit positions within the first set of binary addresses, wherein the predetermined second bit positions of the first plurality of bit positions within the first set of binary addresses are different than the predetermined first bit positions within the first set of binary addresses;

to generate a received third data stream from the received signal, demapping received data from predetermined first bit positions of a second plurality of bit positions within a second set of binary addresses that each correspond to one of a second set of symbols of a second constellation of a second modulation format according to which the lower edge carrier was modulated at the transmitter, wherein the predetermined first bit positions of the second first plurality of bit positions within the second set of binary addresses have an error probability that is less than an average error probability associated with the second plurality of bit positions within the second set of binary addresses;

to generate a received fourth data stream from the received signal, demapping received data from predetermined second bit positions of the second plurality of bit positions within the second set of binary addresses, wherein the predetermined second bit positions of the second plurality of bit positions within the second set of binary addresses are different than the predetermined first bit positions within the second set of binary addresses; and wherein the transmitter generated the signal by at least one of:
mapping data to be transmitted, to the predetermined first bit positions within the first set of binary addresses, that is at least predominantly identical to data to be transmitted that is mapped to the predetermined first bit positions within the second set of binary addresses, and
mapping data to be transmitted, to the predetermined second bit positions within the first set of binary addresses, that is at least predominantly identical to data to be transmitted that is mapped to the predetermined second bit positions within the second set of binary addresses.

29. The receiver of claim 28, wherein the receiver is configured for assessing a quality of each of the higher edge carrier and the lower edge carrier in the received signal.

30. The receiver of claim 29, wherein the receiver is configured for assessing the quality of each of the higher edge carrier and the lower edge carrier in the received signal by measuring a bit error rate of at least a portion of the received signal.

31. The receiver of claim 29, wherein the receiver is configured for assessing the quality of each of the higher edge carrier and the lower edge carrier in the received signal by measuring a power spectral density of the edge carrier of the received signal.

32. The receiver of claim 31, wherein the receiver is configured for measuring the power spectral density by at least one of:
an optical performance monitor, and
a digital measurement based on a digitized signal corresponding to the edge carrier of the received signal.

33. The receiver according to claim 28, wherein the signal was generated by the transmitter by mapping, to the predetermined second bit positions within the first set of binary addresses, data to be transmitted that is at least predominantly identical to data to be transmitted that is mapped to the predetermined second bit positions within the second set of binary addresses, and wherein the receiver is further operable to carry out the steps of:
assessing a quality of each of the received second data stream and the received fourth data stream; and
selecting for further processing a one of the received second data stream and the received fourth data stream that is determined, by the assessing step, to be of a higher-quality.

34. The receiver according to claim 28, wherein the received data demapped from the second data stream is at least predominantly identical to the received data demapped from the fourth data stream, and wherein the receiver is configured for co-processing, by maximum ratio combining, each of the received second data stream and the received fourth data stream, to decode the at least predominantly identical data.

35. The receiver according to claim 28, wherein the first modulation format is a same modulation format as the second modulation format.

36. A method for transmitting using a super channel, the super channel having a set of carriers, each of which having a corresponding one of a set of wavelengths, the set of wavelengths being within a predetermined bandwidth, the set of carriers comprising a higher edge carrier and a lower edge carrier, the higher edge carrier having a corresponding highest wavelength among the set of wavelengths and the lower edge carrier having a corresponding a lowest wavelength among the set of wavelengths, the method comprising the steps of:

modulating the higher edge carrier according to a first modulation format, the first modulation format being based on a first constellation comprising a first set of symbols, wherein each symbol of the first set of symbols has a corresponding one of a first set of binary addresses;

modulating the lower edge carrier according to a second modulation format, the second modulation format being based on a second constellation comprising a second set of symbols, wherein each symbol of the second set of symbols has a corresponding one of a second set of binary addresses;

separating digital data to be transmitted on the higher edge carrier into a first data stream and a second data stream;

separating digital data to be transmitted on the lower edge carrier into a third data stream and a fourth data stream;

mapping the first data stream to predetermined first bit positions of a first plurality of bit positions within the first set of binary addresses, and the second data stream to predetermined second bit positions of the first plurality of bit positions within the first set of binary addresses, wherein the predetermined first bit positions within the first set of binary addresses have an error probability that is less than an average error probability associated with the first plurality of bit positions within the first set of binary addresses;

mapping the third data stream to predetermined first bit positions of a second plurality of bit positions within the second set of binary addresses, and the fourth data stream to predetermined second bit positions of the second plurality of bit positions within the second set of binary addresses, wherein the predetermined first bit positions within the second set of binary addresses have an error probability that is less than an average error probability associated with the second plurality of bit positions within the second set of binary addresses; and wherein at least one of:
the first data stream is identical to the third data stream, and
the second data stream is identical to the fourth data stream.

37. The method according to claim 36, wherein the data separated into the second data stream is identical to the data separated into the fourth data stream, and wherein the data separated into the first data stream is different from the data separated into the third data stream.

38. The method according to claim 36, wherein the data separated into the second data stream is identical to the data separated into the fourth data stream, and wherein the data separated into the first data stream is identical to the data separated into the third data stream.

39. The method according to claim 36, wherein forward error correction is applied to at least one of:
the first data stream separately from an application of forward error correction to the second data stream, and
the third data stream separately from an application of forward error correction to the fourth data stream.

40. The method of claim 36, wherein at least one of the first modulation format and the second modulation format is one of 16QAM, 32QAM, 64QAM, or 128QAM.

* * * * *